A method of identifying multi-phase devices in a time trace disaggregation process

(12) United States Patent
Alles

(10) Patent No.: US 9,018,936 B2
(45) Date of Patent: Apr. 28, 2015

(54) IDENTIFYING MULTI-PHASE DEVICES IN A TIME TRACE DISAGGREGATION PROCESS

(75) Inventor: Harold Gene Alles, Lake Oswego, OR (US)

(73) Assignee: Verlitics LLC, Portland, OR (US)

( * ) Notice: Subject to any disclaimer, the term of this patent is extended or adjusted under 35 U.S.C. 154(b) by 88 days.

(21) Appl. No.: 13/598,359

(22) Filed: Aug. 29, 2012

(65) Prior Publication Data

US 2014/0062456 A1 Mar. 6, 2014

(51) Int. Cl.
*G01R 25/00* (2006.01)

(52) U.S. Cl.
CPC ........................ *G01R 25/00* (2013.01)

(58) Field of Classification Search
CPC ................ G01R 31/31924; G01R 31/31932; G01R 31/31937; G01R 31/343; G01R 31/3665; G01R 31/40
USPC ...................... 324/86, 76.52, 76.77
See application file for complete search history.

(56) References Cited

U.S. PATENT DOCUMENTS

| | | |
|---|---|---|
| 4,858,141 A | 8/1989 | Hart et al. |
| 5,216,623 A | 6/1993 | Barrett et al. |
| 5,483,153 A | 1/1996 | Leeb et al. |
| 5,572,438 A | 11/1996 | Ehlers et al. |
| 5,706,191 A | 1/1998 | Bassett et al. |
| 6,470,283 B1 | 10/2002 | Edel |
| 6,868,293 B1 | 3/2005 | Schurr et al. |
| 6,906,617 B1 | 6/2005 | Van der Meulen |
| 6,983,210 B2 | 1/2006 | Matsubayashi et al. |
| 7,174,260 B2 | 2/2007 | Tuff et al. |
| 7,246,014 B2 | 7/2007 | Forth et al. |
| 7,343,226 B2 | 3/2008 | Ehlers et al. |
| 7,379,997 B2 | 5/2008 | Ehlers et al. |
| 7,423,546 B1 | 9/2008 | Aisa |
| 7,460,930 B1 | 12/2008 | Howell et al. |
| 8,217,640 B2* | 7/2012 | Tazzari et al. ................... 324/66 |
| 2010/0191487 A1* | 7/2010 | Rada et al. ...................... 702/60 |

* cited by examiner

*Primary Examiner* — Tung X Nguyen

(57) ABSTRACT

A method of identifying multi-phase devices in a time trace disaggregation process can include detecting a multi-phase transition, identifying multi-phase devices based on the detecting, and processing the multi-phase devices separate from single-phase devices. The method can also include initializing a multi-phase array and, for each of a plurality of supply legs, determining whether a qualified transition exists. If so, the method can further include determining whether there is a pending multi-phase transition. If so, the method can further include determining whether the pending multi-phase transition is positive. If so, the method can further include creating a multi-phase instance. The method can also include storing the multi-phase instance in the multi-phase array.

21 Claims, 4 Drawing Sheets

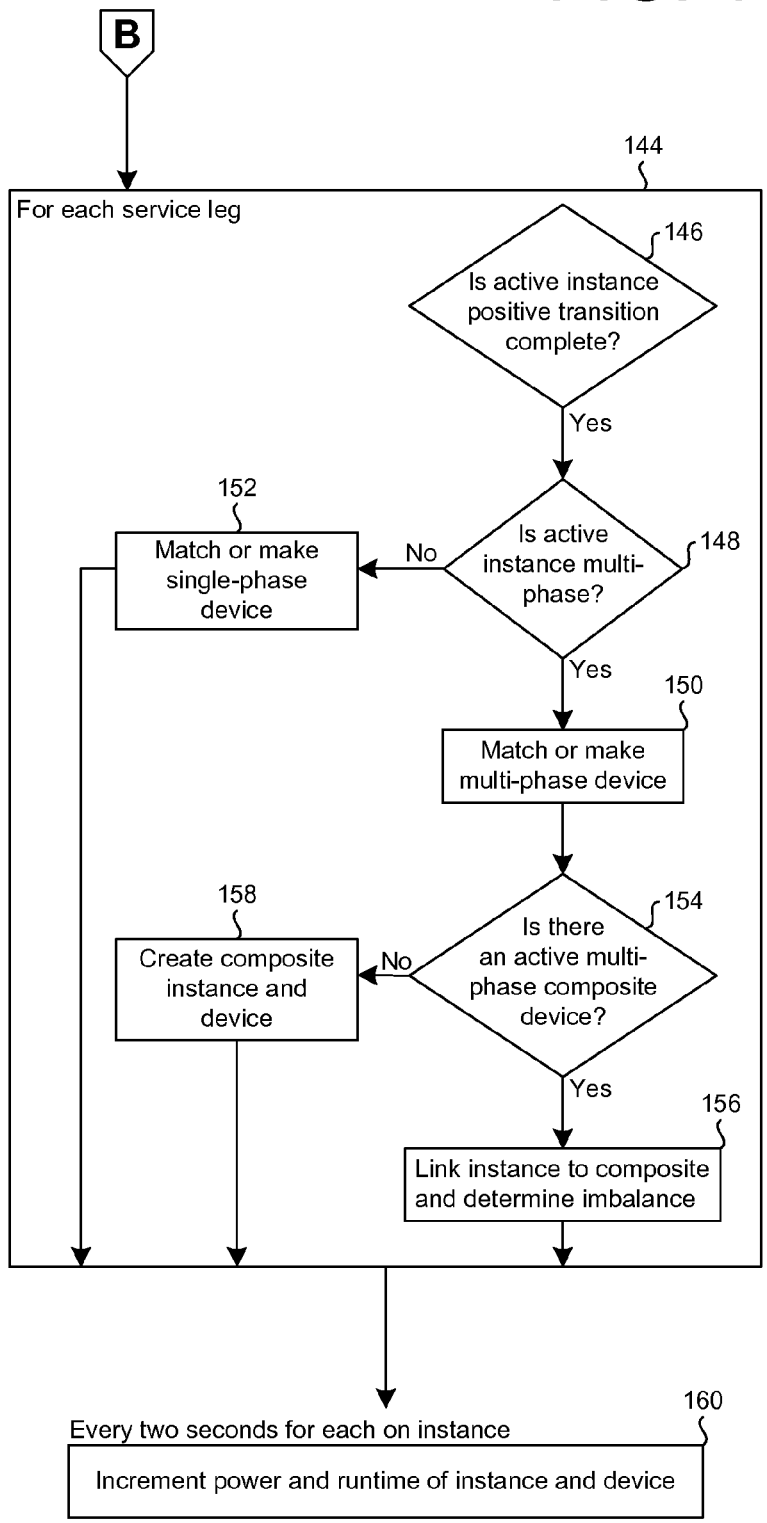

IDENTIFYING MULTI-PHASE DEVICES IN A TIME TRACE DISAGGREGATION PROCESS

TECHNICAL FIELD

This disclosure relates generally to time trace disaggregation processes, and more particularly to processes and operations for identifying multi-phase instances and devices therein.

BACKGROUND

Previous processes for identifying multiple individual loads supplied by a common AC power service use measurements of electrical parameters of only the common supply. These parameters are digitally measured for each alternating current (AC) supply cycle, e.g., 60 samples per second in North America. The loads are identified using the time dependent behaviors (referred to herein as time traces) of the first few seconds of the turn-on positive transition of these parameters. Many conventional devices such as incandescent lights and heaters consume essentially constant power after the positive transition until the device is turned off, thus producing a negative transition. Provided none of the transitions occur too close together, the on-off state of multiple devices can be accurately determined, as well as the power, runtime, and energy consumed by each device. This process is referred to herein as a time trace disaggregation process (TTDP).

Residential service is typically split single-phase where the voltage on each supply leg is 180 degrees out of phase relative to neutral. Commercial service is typically three-phase where the voltage on each supply leg is 120 degrees out of phase relative to the other supply legs. Devices that use the most power connect to multiple phases so that current flows directly between service legs rather than through neutral. These devices are generally referred to herein as multi-phase devices.

Since multi-phase loads are between service legs, the power and current transitions occur at the same time and change in current flow is the same in both legs. These characteristics makes it possible to differentiate singe-phase transitions from multi-phase transitions. Likewise, single-phase instances and devices can be processed separately from multi-phase instances and devices. This additional differentiation improves the accuracy of identification and tracking of the multiple different devices found in typical residential and commercial buildings.

DETAILED DESCRIPTION

Implementations of the disclosed technology generally improve the accuracy of a time trace disaggregation process (TTDP). Further, implementations generally provide separate processes for multi-phase device identification and tracking that is compatible with and can share certain processes of current TTDPs.

Figure 1A:
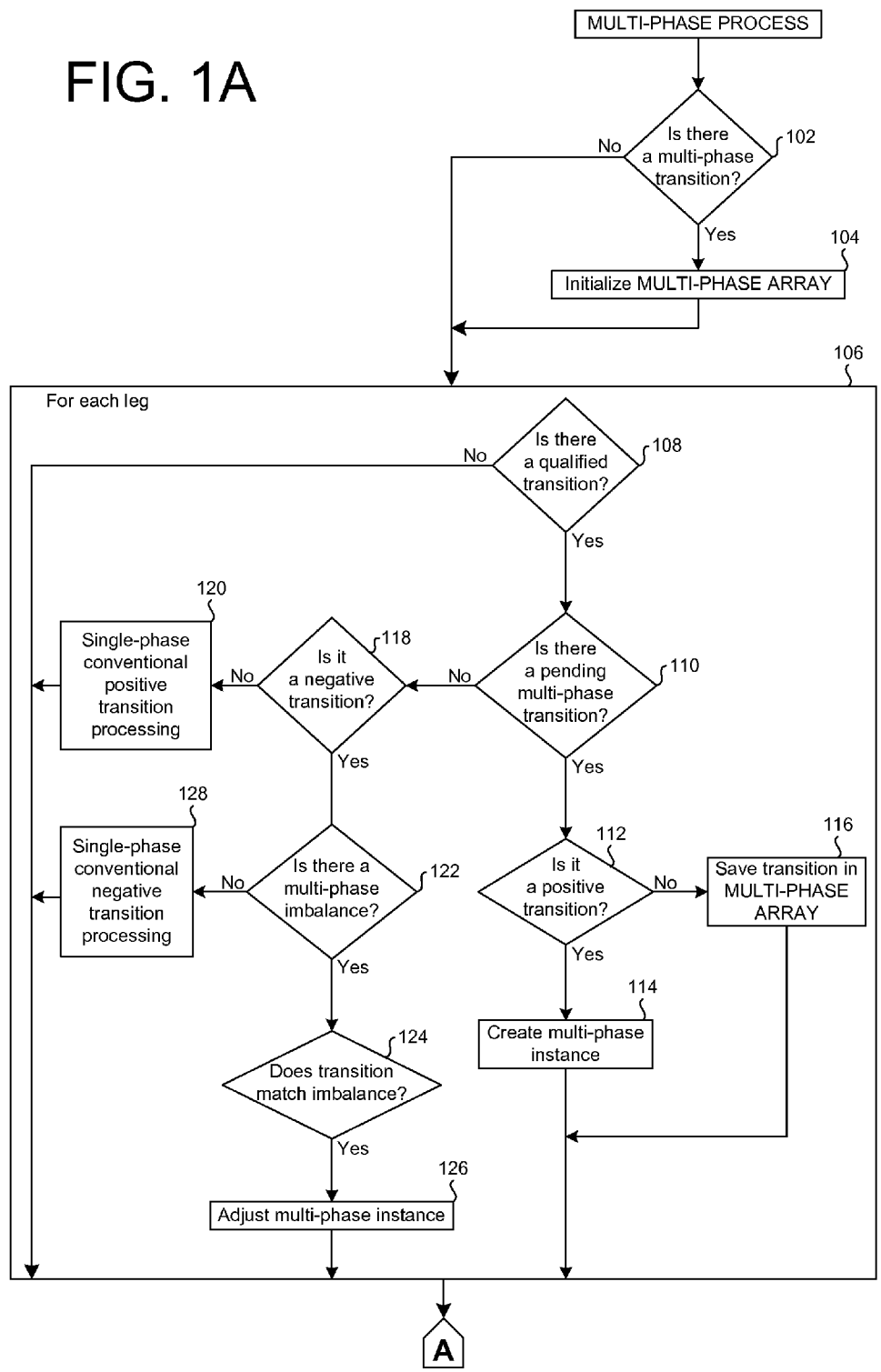
FIG. 1 is a flow diagram of an example of a multi-phase process integrated with a time trace disaggregation process (TTDP) in accordance with certain embodiments of the disclosed technology.
Figure 1B:
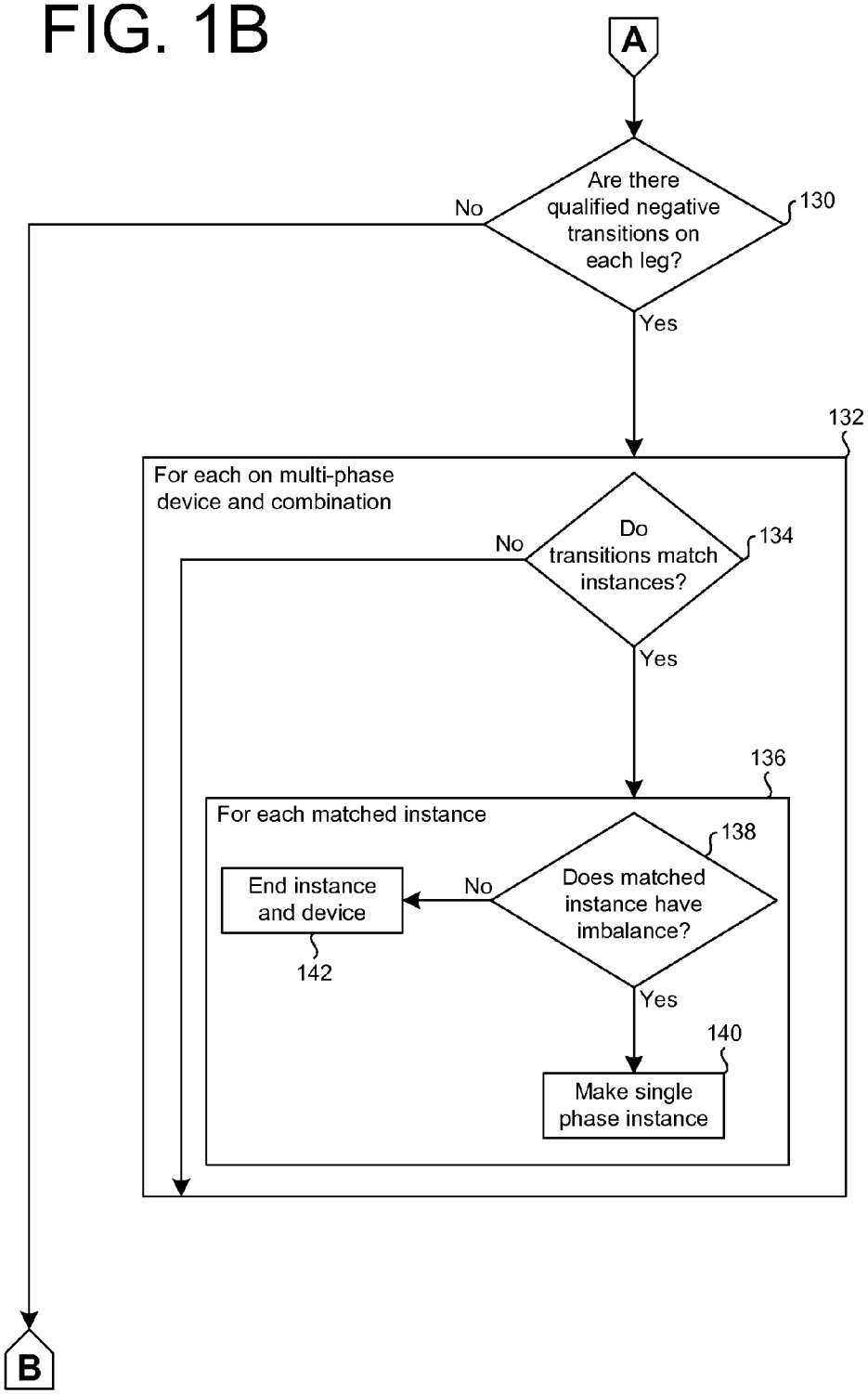

FIG. 1 is a flow diagram of an example of a multi-phase process integrated with a TTDP in accordance with certain embodiments of the disclosed technology. The TTDP typically operates on each sequential sample for each service leg. The processing for each leg is generally independent and, therefore, easily adapted to two-phase and three-phase supplies.

The illustrated multi-phase process generally couples the processing between legs such that positive and negative transitions that occur simultaneously on two or three legs may be associated with a single multi-phase device. Composite multi-phase instances and devices may be used to couple the instances and devices that are independently identified and tracked by the TTDP.

The first part of the multi-phase process generally operates after a new set of samples are read and before the parameters for each leg are processed. Multi-phase transition detection may use, for example, current samples in the range of 2 to 7 samples ahead of TTDP processing that detects the transitions in each leg.

Current samples may be used to detect transitions because current is relatively insensitive to the mix of power and reactive power. This may be particularly important for three-phase supplies because the current flow is typically between legs with voltage phase shifted by 120 degrees. Therefore, the current may be significantly phase shifted from both voltages. This may cause the calculated reactive power to be large even for purely resistive loads.

In certain embodiments, multi-phase transition detection involves calculating five differences between six consecutive current samples for each service leg. A measure of the correlation between these differences may then be calculated for each pair of legs. For single-phase service, there is typically one pair. For three-phase service, there are typically three pairs.

The measure of the correlation (MC) is generally the square root of the sum of the product of the differences divided by one half of the sum of the squares of the differences. For example, in situations where the differences are DIFX[1], DIFX[2], DIFX[5] and DIFY[1], DIFY[2], . . . DIFY[5], the sum of the product of the differences (SPD) would be $$SPD = DIFX[1]*DIFY[1] + DIFX[2]*DIFY[2] + \ldots DIFX[5]*DIFY[5].$$

The sum of the square of the differences (SSD) in such situations would be $$SSD = (DIFX[1]*DIFX[1] + DIFY[1]*DIFY[1]) + \\ (DIFX[2]*DIFX[2] + DIFY[2]*DIFY[2]) + \\ \ldots (DIFX[5]*DIFX[5] + DIFY[5]*DIFY[5]).$$

The MC may thus be determined as follows:

$$MC = \text{square root}(SPD/(2*SSD))$$

The MC is equal to 1 if the correlation is perfect. However, measurement errors and noise usually make the correlation less than perfect, so the MC is typically less than 1.

Certain devices combine multi-phase and single-phase behavior. For example, many residential electric clothes dryers have multi-phase heater elements combined with a single-phase motor, which typically drives the blower and tumbler. When the dryer is started, the motor usually turns on at the same time as the heater. Therefore, the transition on the leg supplying the motor is generally substantially larger than the transition on the leg supplying only the heater.

In certain situations, two independent single-phase devices may make transitions at approximately the same time. Some devices, such as thermostatically controlled heaters, may make many positive and negative transitions while on. These devices may increase the probability of simultaneous coincident transitions.

A threshold may be selected that differentiates coincident multi-phase transitions that are unbalanced from coincidental single-phase transitions. For example, a threshold of 0.9 may be used in certain implementations such that a multi-phase transition may be detected if the MC is greater than 0.9.

Transitions may occur within one sample or within several samples. A fast transition will typically cause the MC to be greater than 0.9 for several samples. A multi-phase transition is typically not detected until the first non-zero correlation occurs in the difference between the second and third sample before the TTDP processing.

Multi-phase transition detection generally enforces minimum limits on the number of samples between consecutive transitions. For example, all transitions may be suppressed for 50 samples after a positive transition. This may ensure that all of the features that may be associated with a positive transition are captured in a single positive transition trace. Also, all transitions may be suppressed for 5 samples after a negative transition.

If a multi-phase transition is detected at 102, a MULTI-PHASE ARRAY may be initialized, as indicated by 104. In certain embodiments, this array contains the following elements for each leg:
1. Transition State (TRANS)—a state variable used when processing multi-phase transitions. Pending multi-phase transitions may be specified by this state.
2. Instance Number (INST)—the number of the instance created by the positive transition on the leg.
3. Device Number (DEV)—the number of the device associated with the instance INST.
4. Composite Device Number (CDEV)—the number of the composite device that is associated with all of the instances created by the multi-phase transition.

After the check for multi-phase transitions at 102, a TTDP process 106 independently processes the parameters for each leg. The first test is for a qualified transition, as indicated at 108. Any of a variety of criteria may be used to suppress transitions caused by noise and the normal behavior of devices during positive transitions.

If there is a qualified transition, the state variable TRANS (e.g., in MULTI-PHASE ARRAY) may be tested for a pending multi-phase transition, as indicated by 110. If there is a pending multi-phase transition, and if the qualified transition is positive (as determined at 112), then a multi-phase instance may be created, as indicated by 114, the instance number may be stored in INST, and TRANS may be set to the next positive transition state value; otherwise, if the transition is not positive, the transition may be stored in the MULTI-PHASE ARRAY, as indicated by 116.

If there is a pending multi-phase transition, and if the qualified transition is negative (as determined at 118), then TRANS may be set to the next negative transition state value. The transition qualification process may accurately determine the magnitude of the changes in power, reactive power, and current. These values may be preserved for latter use.

If there is no pending multi-phase transition, and if the qualified transition is positive, then the positive transition may be processed normally by TTDP, as indicated by 120.

If the qualified transition is negative, then a check for multi-phase imbalance may be made, as indicated by 122. An imbalance associated with each multi-phase instance [that is on] may be compared to the negative transition, as indicated by 124. Such comparison may be made for power, reactive power and current. If there is a match, then the imbalance of the matching instance may be set to zero, as indicated by 126. Such action may reduce the power attributed to the instance so that it is now the same as its corresponding instance on the other leg If there is no matching imbalance, then the negative transition may be processed normally by TTDP, as indicated by 128.

After the TTDP process 106 is completed for each leg, the value of each TRANS may be tested for the qualified negative transition state, as indicated by 130. If there are qualified negative transitions for each expected leg, then a first sub-process 132 may be used to compare the transition pair (or triplet) with the instances of each multi-phase device that is on, as indicated by 134.

If a matched instance has an imbalance, as determined at 138, then the comparisons may be made with and without the imbalance. If there is a match with the imbalance excluded, then a second sub-process 136 may be used to modify these to be single-phase instances and devices using the imbalance values for the on going power, reactive power, and current, as indicated by 140; otherwise, the second sub-process 136 may end the instance and the device, as indicated by 142.

Since there is typically high confidence that the negative transition is a multi-phase transition, the matching process may be used to force a match if at all possible. In this manner, it may advantageously allow for a variety of special cases that may occur.

For example, certain electric clothes dryers have two heater elements, each independently controlled by separate thermostats. When the first element is turned on, both heater elements turn on at the exact same time, so the device is identified as a large multi-phase heater. Later, one element turns off while the other remains on. The resulting multi-phase negative transitions are about half the magnitude of the multi-phase positive transitions, so there is generally no match. If there is no other choice, then the power associated with each instances may be reduced by the magnitude of the negative transitions. If another multi-phase negative transition is processed, then comparison may be made to the reduced values.

Later in the clothes dryer cycle, the heater elements may turn on at different times but turn off at exactly the same time. In such situations, the multi-phase negative transitions will generally be about twice the magnitude of either of the instances. If there is no match to single instances, then all combinations of all pairs of multi-phase instances may be compared to the multi-phase negative transitions. If a match is found, then both sets of instances may be turned off.

After the second sub-process 136 completes, the MULTI-PHASE ARRAY values may be reset.

After the first sub-process 132 completes, a third sub-process 144 may be used to process each service leg to update its active instance. As described herein, the active instance generally refers to the instance created by the last positive transition. It typically remains active until there is another transition. The positive transition may be considered complete, for example, when the parameters become stable or 300 samples after the positive transition, which ever is shortest. This sequence of samples may be used by the TTDP process to identify the device that created the transition.

In situations where the positive transition is complete (as determined at 146) and the active instance is multi-phase (as determined at 148), the instance may be compared to the existing multi-phase devices. If a match is found, then the instance may be associated with the existing device or, if a match is not found, then the instance may be used as the template to create a new multi-phase device, as indicated by 150.

In situations where the positive transition is complete (as determined at 146) and the active instance is not multi-phase (as determined at 148), the instance may be compared to the existing single-phase devices. If a match is found, then the instance may be associated with the existing device or, if a match is not found, then the instance may be used as the template to create a new single-phase device, as indicated by 152.

The TTDP process may use the composite device structure as way to group and track sub-components of a composite device so the composite device can be reported as a single device. Each multi-phase device may be represented by a multi-phase composite device. At least two multi-phase devices may be associated with each multi-phase composite device, but there may be many associated devices. For example, a composite clothes dryer device may group the following ten devices:

1. 1200 watt heaters for each leg
2. 2400 watt heaters for each leg
3. Stepped heaters for each leg that start at 2400 watts and step down to 1200 watts within 10-50 samples
4. Stepped heaters for each leg that start at 1200 watts and step up to 2400 watts within 10-50 samples
5. A 2400 watt heater plus motor for one leg
6. A motor for one leg A composite device may be created when the first of its devices is identified. A composite device is turned off after all associated devices are off for a predetermined time. This time delay enables the composite device to remain in the on state while its component devices cycle on and off.

In the sub-process 144, after the multi-phase device is matched or created, CDEV in the MULTI-PHASE ARRAY may be tested for each leg, as indicated by 154. If any other multi-phase transition leg is associated with a composite device, then the current device and instance may be associated with the same composite device, as indicated by 156.

If a composite device is not associated with any other multi-phase transition leg and the current device is associated with a composite device, then CDEV may be set to that composite device and a composite instance may be created.

If there is no composite device associated with the current multi-phase device, then a new composite device and instance may be created, as indicated by 158, and CDEV may be set the newly created composite device.

After the last multi-phase device is associated with the composite device, the power, reactive power, and current parameters are generally stable for all multi-phase instances associated with the multi-phase positive transition. The imbalance may then determined, as further indicated by 156.

The imbalance generally includes values for power, reactive power, and current. The instance with the smallest power typically has no imbalance. The imbalance of the other instances is usually the difference between its parameter values and the corresponding values of the smallest power instance. If the difference in power is approximately zero, then the power, reactive power, and current imbalance may be set to zero.

Most multi-phase transitions occur on only two legs, so only one instance can usually have imbalance. In certain situations, a three-phase device could have two instances with imbalance.

After all multi-phase instances have been associated with devices and a composite device, the MULTI-PHASE ARRAY values may be reset.

The active instance for each leg may be processed each sample time. Any transition on the leg generally suspends the instance, and thereafter it may be processed the same as other on instances. Instances are generally ended when matched to a negative transition.

Another sub-process 160 generally operates every two seconds for each on instance (e.g., 120 samples). The power and run time of all instances and devices may be incremented. The multi-phase composite devices may be tested and turned off if sufficient time has passed since the last associated instance turned off.

Figure 2:
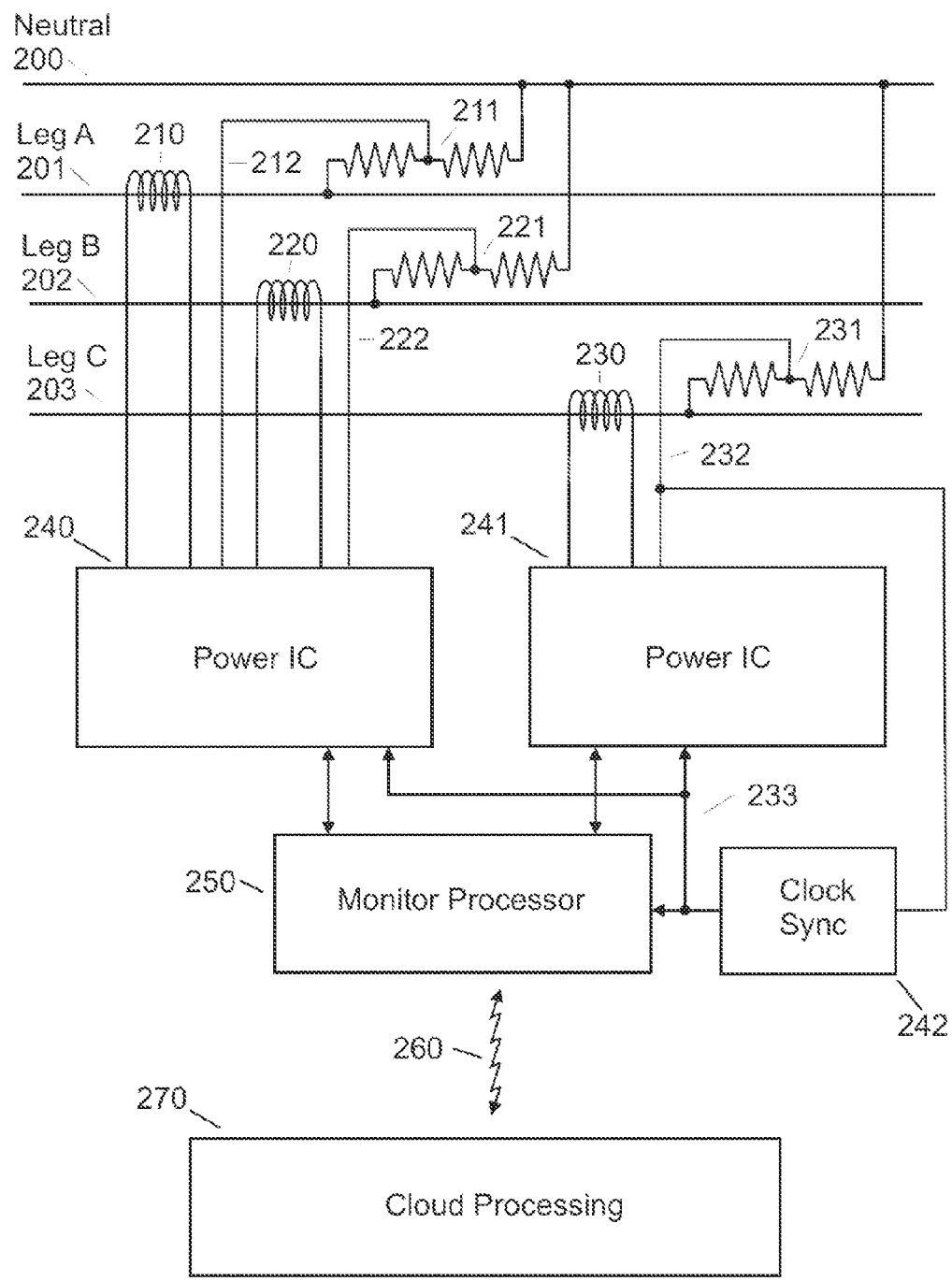
FIG. 2 is a block diagram illustrating a power monitor adapted for three-phase AC supply in accordance with certain embodiments of the disclosed technology.

FIG. 2 is a block diagram illustrating a power monitor adapted for three-phase AC supply in accordance with certain embodiments of the disclosed technology. In the example, the AC supply comprises Leg A 201, Leg B 202, Leg C 203, and Neutral 200. The AC voltage of each leg in the example is 120 degrees phase shifted relative to each of the other two legs.

In the example, a first current transformer 210 may provide a measure of the current in Leg A 201. A first voltage divider 211 may provide a measure 212 of the voltage of Leg A 201. The measures of the current and voltage may be connected to a first Power IC 240.

In the example, a second current transformer 220 may provide a measure of the current in Leg B 202. A second voltage divider 221 may provide a measure 222 of the voltage of Leg B 202. The measures of the current and voltage may be connected to the first Power IC 240.

In the example, a third current transformer 230 may provide a measure of the current in Leg C 203. A third voltage divider 231 may provide a measure 232 of the voltage of Leg C 203. The measures of the current and voltage may be connected to a second Power IC 241.

Power ICs 240 and 241 may be designed specifically for use in utility power meters. Either or both of the Power ICs 240 and 241 may contain analog conditioning circuits and a 16-bit, 4-channel analog-to-digital converter (ADC) for converting the sensed current and voltage signals into numerical values. It may also contain digital processing circuits for providing various measures of power and other characteristics of the voltage and current sensed in Leg A 201, Leg B 202, Leg C 203, or any suitable combination thereof.

The Power ICs 240 and 241 may be controlled by a Monitor Processor 250. The processed data may be read by the Monitor Processor 250. The Monitor Processor 250 may be implemented as a single chip programmable processor with sufficient processing capacity to read the electrical parameters from the Power ICs 240 and 241 and communicate the measurements.

The Monitor Processor 250 may communicate with Cloud Processing 270 via a wireless interne connection 260, for example. In certain embodiments, any or all portions of the TTDP process may be performed using Cloud Processing 270 and the results communicated via web pages, for example.

A Clock Sync 242 may use the voltage signal 232 and generate a clock signal 233 such that it is an integer multiple of the AC supply frequency. The multiple may be selected such that the Power ICs 240 and 241 may sample the currents and voltages an integer number of times per AC cycle. In certain embodiments there may be 67 samples per cycle.

The Monitor Processor 250 may read the measured and processed parameters exactly once each AC cycle. When the monitoring begins after power is applied or after reset, the Monitor Processor 250 may synchronize these reads with the zero crossing of Leg A 201 voltage and Leg C 203 voltage.

This may ensure that the power and reactive power calculations are consistent after a reset.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method of identifying multi-phase load devices in a time trace disaggregation process performed by a programmed computing machine, the method comprising:
    detecting a multi-phase transition;
    identifying at least one multi-phase load device based on the detecting, wherein the at least one multi-phase load device is separate from at least one single-phase load device; and
    processing the at least one multi-phase load device separate from the at least one single-phase load device.

2. The method of claim 1, wherein the processing comprises:
    initializing a multi-phase array; and
    for each of a plurality of supply legs:
        determining whether a qualified transition exists;
        responsive to a determination that a qualified transition exists, determining whether there is a pending multi-phase transition;
        responsive to a determination that there is a pending multi-phase transition, determining whether the pending multi-phase transition is positive;
        responsive to determination that the pending multi-phase transition is positive, creating a multi-phase instance; and
        storing the multi-phase instance in the multi-phase array.

3. The method of claim 2, wherein the multi-phase array comprises each of the following elements for each of the plurality of supply legs:
    a transition state variable (TRANS) for specifying the pending multi-phase transition; and
    an instance number (INST) for specifying the number of the created multi-phase instance.

4. The method of claim 3, wherein the multi-phase array further comprises each of the following elements for each of the plurality of supply legs:
    a device number (DEV) for specifying the number of a device associated with INST; and
    a composite device number (CDEV) for specifying the number of a composite device that is associated with instances created by the pending multi-phase transition.

5. The method of claim 2 further comprising, responsive to a determination that there is not a pending multi-phase transition, determining whether the qualified transition is a negative transition.

6. The method of claim 5 further comprising, responsive to a determination that the qualified transition is not a negative transition, performing single-phase conventional positive transition processing.

7. The method of claim 5 further comprising, responsive to a determination that the qualified transition is a negative transition, determining whether a multi-phase imbalance exists.

8. The method of claim 7 further comprising, responsive to a determination that a multi-phase imbalance does not exist, performing single-phase conventional negative transition processing.

9. The method of claim 7 further comprising, responsive to a determination that a multi-phase imbalance does exist, determining whether the negative transition matches the multi-phase imbalance.

10. The method of claim 9 further comprising, responsive to a determination that the negative transition matches the multi-phase imbalance, setting the imbalance of the matching multi-phase imbalance to zero.

11. The method of claim 2, further comprising determining whether there are qualified negative transitions on each leg.

12. The method of claim 11, further comprising, responsive to a determination that there are qualified negative transitions on each leg, determining whether the qualified negative transitions match instances of each multi-phase load device that is currently on.

13. The method of claim 12, further comprising, responsive to a determination that the qualified negative transitions match the instances of each multi-phase load device that is currently on, determining whether each matched instance has an imbalance.

14. The method of claim 11, further comprising, responsive to a determination that there are not qualified negative transitions on each leg, determining for each service leg whether the active instance positive transition is complete.

15. The method of claim 14, further comprising, responsive to a determination that the active instance positive transition is complete, determining whether the active instance is multi-phase.

16. The method of claim 15, further comprising, responsive to a determination that the active instance is multi-phase, comparing the active instance to existing multi-phase load devices.

17. The method of claim 16, further comprising, responsive to a matching of the active instance to an existing multi-phase load device, associating the active instance with the existing multi-phase load device.

18. The method of claim 16, further comprising, responsive to no matching of the active instance to any existing multi-phase load device, creating a new multi-phase load device based on the active instance.

19. The method of claim 17, further comprising determining whether there is an active multi-phase composite device.

20. The method of claim 19, further comprising, responsive to a determination that there is an active multi-phase composite device, associating the active instance with the active multi-phase composite device.

21. The method of claim 19, further comprising, responsive to a determination that there is not an active multi-phase composite device, creating a new composite instance and device based on the active instance.

* * * * *